United States Patent
Lee et al.

(10) Patent No.: US 8,426,837 B2
(45) Date of Patent: Apr. 23, 2013

(54) RESISTIVE MEMORY DEVICE AND METHOD OF MANUFACTURING THE SAME

(75) Inventors: Myoung-jae Lee, Suwon-si (KR);
Young-soo Park, Yongin-si (KR);
Jung-hyun Lee, Yongin-si (KR);
Soon-won Hwang, Seoul (KR);
Seok-jae Chung, Seongnam-si (KR);
Chang-soo Lee, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 566 days.

(21) Appl. No.: 12/073,666

(22) Filed: Mar. 7, 2008

(65) Prior Publication Data
US 2008/0278989 A1   Nov. 13, 2008

(30) Foreign Application Priority Data
May 11, 2007   (KR) .................. 10-2007-0046200

(51) Int. Cl.
*H01L 29/02* (2006.01)
*H01L 29/06* (2006.01)
*H01L 47/00* (2006.01)

(52) U.S. Cl.
USPC ............. 257/3; 257/2; 257/5; 257/E29.002; 257/E29.006; 257/E47.001

(58) Field of Classification Search ............. 257/2–5, 257/295, E29.002–E29.007, E47.001; 365/163
See application file for complete search history.

(56) References Cited

U.S. PATENT DOCUMENTS

| | | | | |
|---|---|---|---|---|
| 5,166,758 A | * | 11/1992 | Ovshinsky et al. | 257/3 |
| 6,117,720 A | | 9/2000 | Harshfield | |
| 6,507,061 B1 | * | 1/2003 | Hudgens et al. | 257/295 |
| 6,864,521 B2 | * | 3/2005 | Moore et al. | 257/296 |
| 6,872,963 B2 | * | 3/2005 | Kostylev et al. | 257/2 |
| 7,049,623 B2 | * | 5/2006 | Lowrey | 257/3 |
| 7,151,273 B2 | * | 12/2006 | Campbell et al. | 257/3 |
| 7,598,112 B2 | * | 10/2009 | Park et al. | 438/95 |
| 7,863,596 B2 | * | 1/2011 | Karpov et al. | 257/3 |
| 2006/0097341 A1 | * | 5/2006 | Pellizzer et al. | 257/528 |
| 2006/0203541 A1 | * | 9/2006 | Toda | 365/163 |
| 2006/0226409 A1 | * | 10/2006 | Burr et al. | 257/2 |
| 2006/0226411 A1 | * | 10/2006 | Lee | 257/2 |
| 2006/0237756 A1 | * | 10/2006 | Park et al. | 257/296 |
| 2007/0238225 A1 | * | 10/2007 | Wicker | 438/128 |
| 2009/0184305 A1 | * | 7/2009 | Lee et al. | 257/2 |

FOREIGN PATENT DOCUMENTS

| | | |
|---|---|---|
| KR | 10-0613669 | 8/2006 |
| KR | 10-0682926 | 2/2007 |
| KR | 10-0773537 | 10/2007 |

* cited by examiner

*Primary Examiner* — Allison P Bernstein
(74) *Attorney, Agent, or Firm* — Harness, Dickey & Pierce, P.L.C.

(57) ABSTRACT

Provided is a resistive memory device and a method of manufacturing the resistive memory device that includes a bottom electrode, an insulating layer that is formed on the bottom electrode and has a hole that exposes the bottom electrode, a resistance layer and an intermediate layer which are formed in the hole, a switch structure formed on a surface of the intermediate layer, and an upper electrode formed on the switch structure.

11 Claims, 7 Drawing Sheets

RESISTIVE MEMORY DEVICE AND METHOD OF MANUFACTURING THE SAME

CROSS-REFERENCE TO RELATED PATENT APPLICATION

This application claims the benefit of Korean Patent Application No. 10-2007-0046200, filed on May 11, 2007, in the Korean Intellectual Property Office, the disclosure of which is incorporated herein in its entirety by reference.

BACKGROUND OF THE INVENTION

1. Field of the Invention

The present invention relates to a resistive memory device, and more particularly, to a resistive memory device that has an increased contact area for switching while maintaining the integration density of the resistive memory device and a method of manufacturing the resistive memory device.

2. Description of the Related Art

A conventional semiconductor memory array includes a large number of unit memory cells that are electrically connected to one another. In the case of dynamic random access memory (DRAM), which is an example of semiconductor memory, a unit memory cell generally includes one switch and one capacitor. The DRAM has high integration density and high operation speed. However, when the power is turned off, stored data are erased. An example of non-volatile memory device is flash memory in which stored data are kept even when the power is turned off. The flash memory, unlike volatile memory, has non-volatile characteristics, however, has an integration density and an operation speed lower than the DRAM.

Many researches have been conducted regarding non-volatile memory devices such as magnetic random access memory (MRAM), ferroelectric random access memory (FRAM), phase-change random access memory (PRAM), and resistance random access memory (RRAM). RRAM operates based on the variable resistance characteristics of a transition metal oxide according to states thereof.

FIG. 1A is a cross-sectional view of a conventional resistive memory device. Referring to FIG. 1A, a resistance layer 12 is formed on a lower electrode 11, and an upper electrode 13 is formed on the resistance layer 12. The resistance layer 12 is mainly formed of a transition metal oxide (TMO), and the lower electrode 11 and the upper electrode 13 are formed of a conductive material such as a metal or a metal oxide used for forming general semiconductor memory devices.

FIG. 1B is an I-V graph showing the operational characteristics of a conventional resistive memory device. The horizontal axis indicates the applied voltage, and the vertical axis indicates the current with respect to the applied voltage. Referring to FIG. 1B, when the magnitude of a voltage applied to the resistance layer 12 through the lower electrode 11 and the upper electrode 13 is gradually increased from 0V, the current increases proportionally to the voltage along line G1. However, when a voltage greater than $V_1$ is applied, the resistance of the resistance layer 12 is greatly increased, and thus, the current is reduced. When a voltage between $V_1$ and $V_2$ is applied to the resistance layer 12, the current that flows to the resistance layer 12 is increased along line G2. When a voltage $V_3$ greater than $V_2$ is applied to the resistance layer 12, the resistance is suddenly reduced, and thus, the current follows the line $G_1$. A reset current at which the graph changes from the line G1, which denotes a low resistance state (LRS), to the line G2, which denotes a high resistance state (HRS), that is, a current along the line G1 that corresponds to V1, reduces as the size of the unit cell is reduced. The reduction of reset current by reducing the size of the unit cell is desirable in view of power consumption and integration density.

However, in view of the integration density of a device, in a cross-point memory device, a select switch such as a transistor is essential and a two-step switch, which is advantageous for stacking, may be used. When a diode, which is an example of the two-step switch, is used, a large current density is required to switch the resistive memory device. In order to increase the switching current, an area of the diode that contacts the resistive memory device may be increased.

However, in order to increase the contact area between the diode and the memory device, the size of the memory device must be increased. In this case, the size of the memory device must be increased, thereby reducing the integration density of the memory device.

Therefore, there is a need to develop a resistive memory device having high integration density and increased switching current.

SUMMARY OF THE INVENTION

To address the above and/or other problems, the present invention provides a resistive memory device that has high integration density with a reduced size while ensuring a stable switching current and a method of manufacturing the resistive memory device.

According to an aspect of the present invention, there is provided a resistive memory device comprising: a bottom electrode; an insulating layer that is formed on the bottom electrode and has a hole that exposes the bottom electrode; a resistance layer and an intermediate layer which are formed in the hole; a switch structure formed on a surface of the intermediate layer; and an upper electrode formed on the switch structure.

The resistance layer may comprise a transition metal oxide, a perovskite metal oxide (STO), or a nitride compound.

The transition metal oxide may be selected from the group consisting of Ni oxide, Ti oxide, Hf oxide, Zr oxide, Zn oxide, W oxide, Co oxide, Cu oxide, Nb oxide, and a compound of these oxides.

The resistance layer and the intermediate layer may be sequentially formed according to the shapes of the bottom surface and side surfaces of the hole.

The switch structure may be formed on the intermediate layer and the exposed surface of the resistance layer.

The switch structure may be formed as a non-ohmic structure such as a diode structure, a varistor, or a threshold switching device.

If the switch structure is a diode structure, the diode structure may be a bilayer structure of a p-type semiconductor layer and an n-type semiconductor layer or a bilayer structure of an n-type oxide layer and a p-type oxide layer According to an aspect of the present invention, there is provided a method of manufacturing a resistive memory device, comprising: forming a bottom electrode; forming an insulating layer on the bottom electrode and forming a hole in the insulating layer to expose the bottom electrode; sequentially forming a resistance layer and an intermediate layer in the hole; and sequentially forming a switch structure and an upper electrode on a surface of the intermediate layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
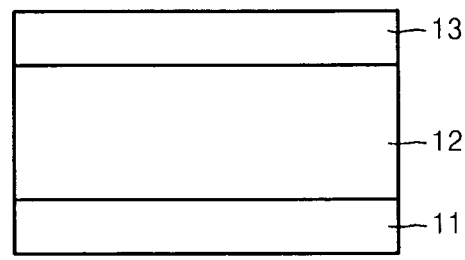
FIG. 1A is a cross-sectional view of a conventional resistive memory device.
Figure 1B:
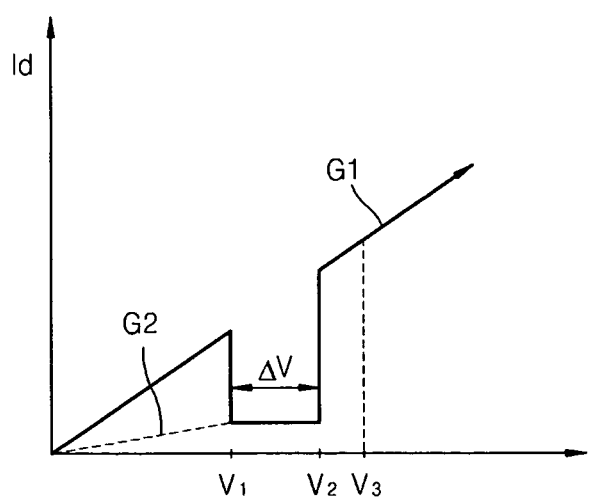
FIG. 1B is an I-V graph showing the operational characteristics of a conventional resistive memory device.

A resistive memory device and a method of manufacturing the resistive memory device according to the present invention will now be described more fully with reference to the accompanying drawings in which exemplary embodiments of the invention are shown. In the drawings, the thicknesses of layers and regions are exaggerated for clarity.

Figure 2:
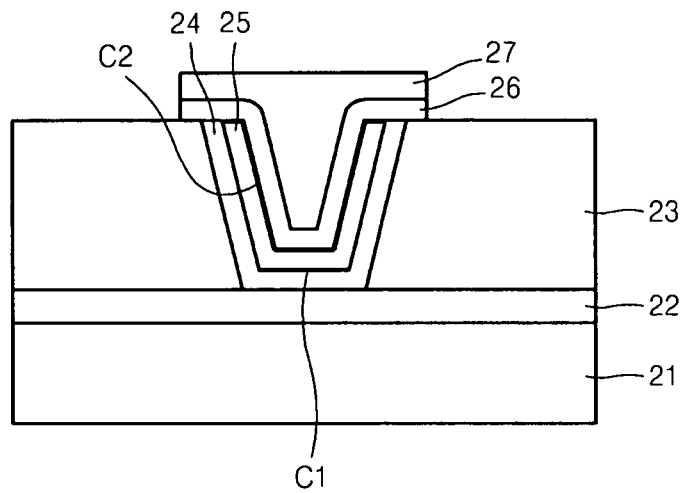
FIG. 2 is a cross-sectional view of the structure of a resistive memory device according to an embodiment of the present invention.

FIG. 2 is a cross-sectional view of a resistive memory device according to an embodiment of the present invention. The resistive memory device of FIG. 2 includes 1S (switch)-1R (variable resistance material).

Referring to FIG. 2, a bottom electrode 22 is formed on a substrate 21, and an insulating layer 23 having a hole is formed on the bottom electrode 22. A resistance layer 24 and an intermediate layer 25 are formed in the hole h of the insulating layer 23. A switch structure 26 and an upper electrode 27 are formed on the surface of the intermediate layer 25. More specifically, the resistance layer 24 and the intermediate layer 25 are formed on a bottom and sides of the hole h of the insulating layer 23. As the resistance layer 24 and the intermediate layer 25 are formed along the shape of the hole h in the hole h, the diameter and depth of the hole h are reduced. The switch structure 26 is formed on an exposed surface of the intermediate layer 25, and the switch structure 26 extends to the exposed surface of the resistance layer 24. The upper electrode 27 is formed on the switch structure 26.

The materials for forming each of the layers that constitute the resistive memory device according to an embodiment of the present invention will now be described. The substrate 21 can be a substrate used for conventional semiconductor devices. The bottom electrode 22, the intermediate layer 25, and the upper electrode 27 can be formed of an electrode material used for conventional semiconductor devices, for example, Al, Hf, Zr, Zn, W, Co, Au, Pt, Ru, Ir, Ti, or a conductive metal oxide. The insulating layer 23 can be formed of a conventional insulating material, for example, $SiO_2$ or $Si_3N_4$. In order to control the inclination of the hole h, the insulating layer 23 can be formed such that, after forming the hole h having a vertical side walls using $SiO_2$, inclined side walls can be formed by coating $Si_3N_4$ on the vertical side walls of the hole h.

The resistance layer 24 is formed of a variable resistance material used for forming a resistive memory device. The variable resistance material has two kinds of resistance characteristics according to an applied current, and can be a transition metal oxide such as Ni oxide, Ti oxide, Hf oxide, Zr oxide, Zn oxide, W oxide, Co oxide, Cu oxide, Nb oxide, and a compound of these oxides, a perovskite metal oxide (STO), or a nitride compound. The transition metal oxide includes at least one selected from the group consisting of NiO, $TiO_2$, HfO, ZrO, ZnO, $WO_3$, CoO, CuO, and $Nb_2O_5$ or a compound of these oxides. The switch structure 26 can be formed as a non-ohmic structure a diode structure, a varistor, or a threshold switching structure. If the switch structure 26 is formed as a diode structure, the diode structure can be a bilayer structure of an n-type semiconductor layer and a p-type semiconductor layer, or a bilayer structure of an n-type oxide layer and a p-type oxide layer.

In the resistive memory device of FIG. 2, a potential for driving a storage node is applied to a bottom region C1 of the intermediate layer 25 where the resistance layer 24 and the intermediate layer 25 contact. Therefore, the integration density of the resistive memory device can be increased by controlling an aspect ratio of the hole h in the insulating layer 23. Also, the contact area C2 between the switch structure 26 and the intermediate layer 25 has a three-dimensional structure, and thus, has a width much larger that that of the hole h, which is a great advantage in increasing the current density for switching the resistive memory device.

A method of manufacturing a resistive memory device according to an embodiment of the present invention will now be described with reference to FIGS. 3A through 3E.

Figure 3A:
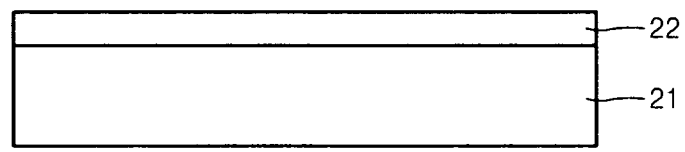
FIGS. 3A through 3E are cross-sectional views illustrating a method of manufacturing a resistive memory device according to an embodiment of the present invention.
Figure 4A:
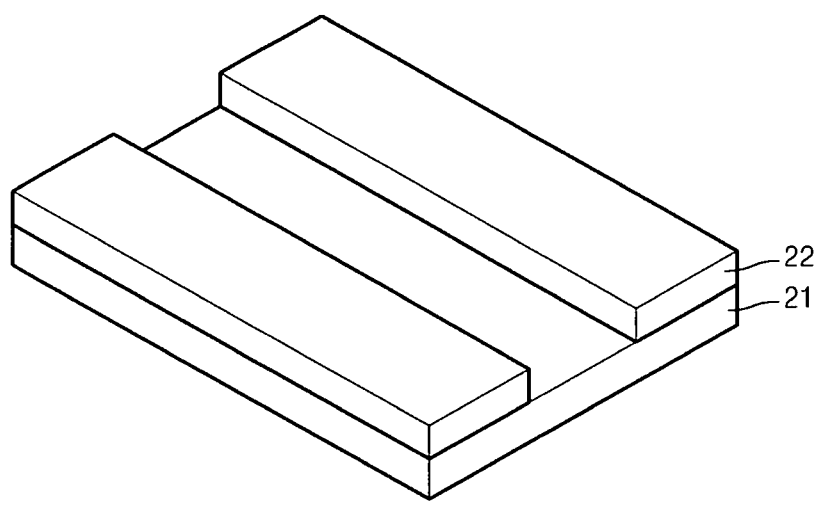
FIGS. 4A through 4C are perspective views illustrating a process of forming a resistive memory device in a cross-point memory array structure, according to an embodiment of the present invention.

Referring to FIG. 3A, a bottom electrode 22 is formed by coating a metal, for example, Al, Hf, Zr, Zn, W, Co, Au, Pt, Ru, Ir, or Ti or a conductive metal oxide, on a substrate 21 formed of, for example, Si. In FIG. 4A, a process of forming a cross point type memory array structure is shown. Referring to FIG. 4A, after an electrode material is coated on the substrate 21, the bottom electrode 22 is formed by patterning the coating.

Figure 3B:
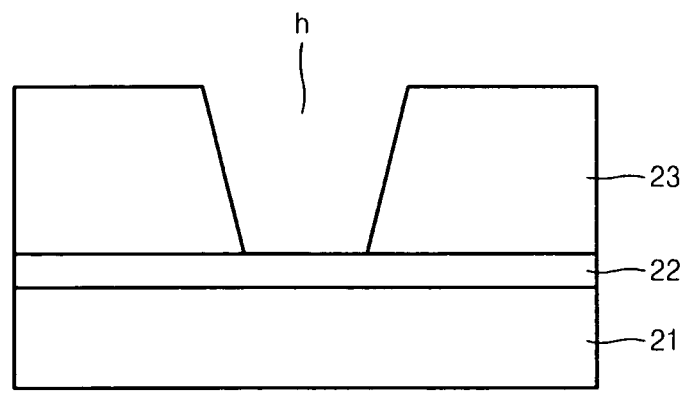
Figure 4B:
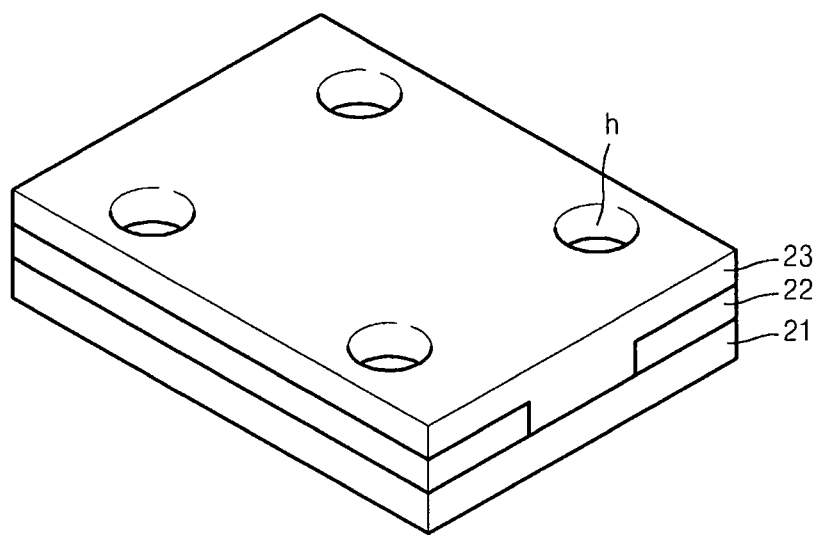

Referring to FIG. 3B, an insulating layer 23 is formed by coating an insulating material such as $SiO_2$ or $Si_3N_4$ on the bottom electrode 22, and a hole h that exposes the bottom electrode 22 is formed by etching the insulating layer 23. Referring to FIG. 4B in which a process of forming a cross point type memory array structure is shown, the insulating layer 23 is formed by coating an insulating material on a region of the bottom electrode line, and then, a plurality of holes h corresponding to the bottom electrode line is formed in the region of the insulating layer 23.

Figure 3C:
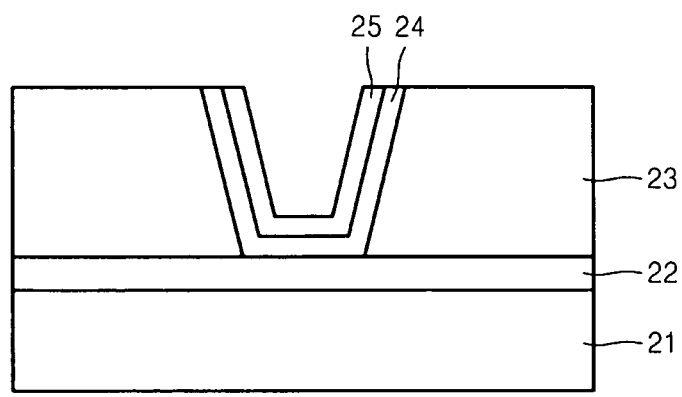

Referring to FIG. 3C, a resistance layer 24 is formed by coating a variable resistance material, for example, a transition metal oxide such as Ni oxide, Ti oxide, Hf oxide, Zr oxide, Zn oxide, W oxide, Co oxide, Cu oxide, Nb oxide, and a compound of these oxides, a perovskite metal oxide (STO), or a nitride compound in the hole h. Next, an intermediate layer 25 is formed by coating a conductive metal, for example, Al, Hf, Zr, Zn, W, Co, Au, Pt, Ru, Ir, or Ti or a conductive metal oxide, and afterwards, the upper surface of the insulating layer 23 is planarized.

Figure 3D:
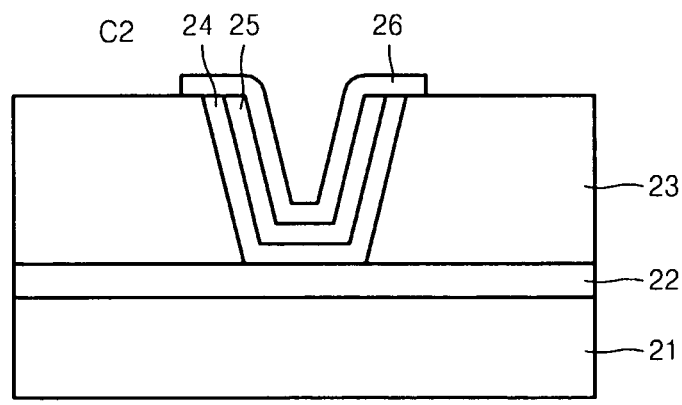

Referring to FIG. 3D, a switch structure 26 is formed by coating a bilayer structure of a p-type semiconductor material and an n-type semiconductor material on the intermediate layer 25. For example, a diode structure can be formed by coating the p-type semiconductor material and an n-type semiconductor material.

Figure 3E:
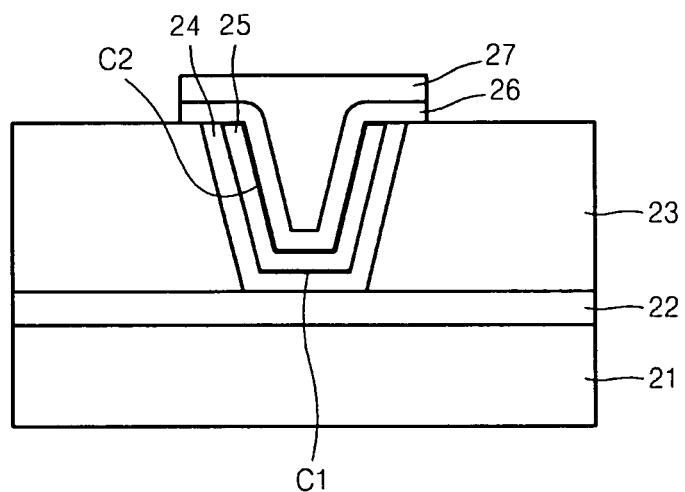
Figure 4C:
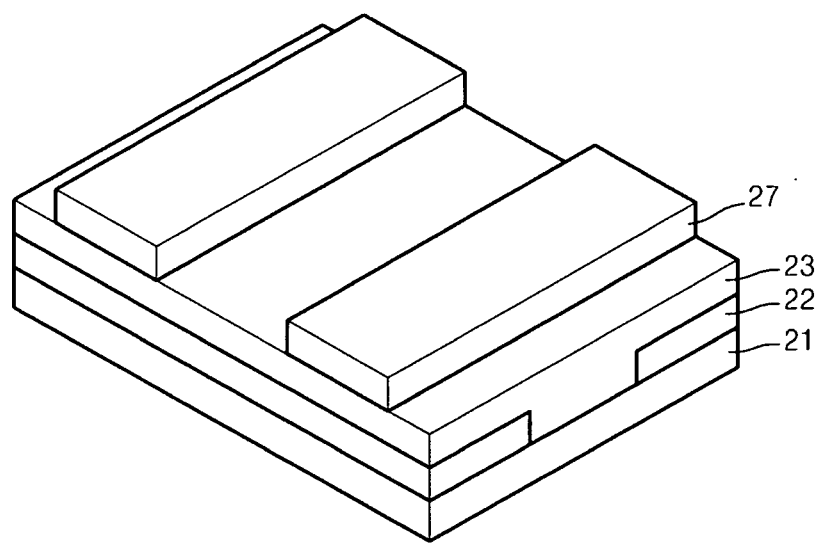
Figure 4D:
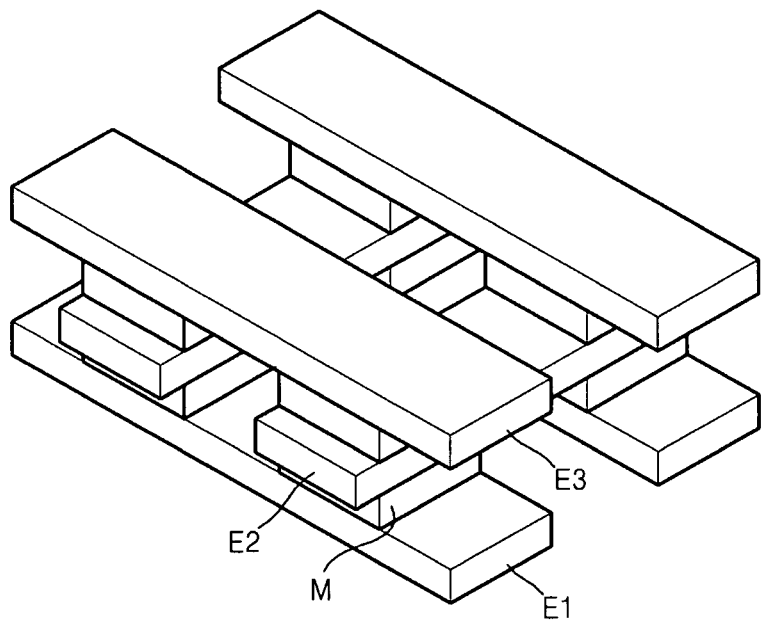
FIG. 4D is a conceptual diagram illustrating a multi-structured cross-point memory array structure according to an embodiment of the present invention.

Referring to FIG. 3E, an upper electrode 27 is formed by coating a conductive metal, for example, Al, Hf, Zr, Zn, W, Co, Au, Pt, Ru, Ir, or Ti or a conductive metal oxide on the switch structure 26. Referring to FIG. 4C in which a process of forming a cross point type memory array structure is shown, the cross point type memory array structure can be formed by forming the upper electrode lines in a direction perpendicular to the bottom electrode lines. While the memory array structure in FIG. 4C represents a single-layered array structure, the process of FIGS. 3B to 3E may be repeated on the upper electrode 27 to form a multiple array structure having a memory region M including a switch structure and a resistance layer between the multiple electrode lines E1, E2 and E3, as shown in FIG. 4D.

Figure 5:
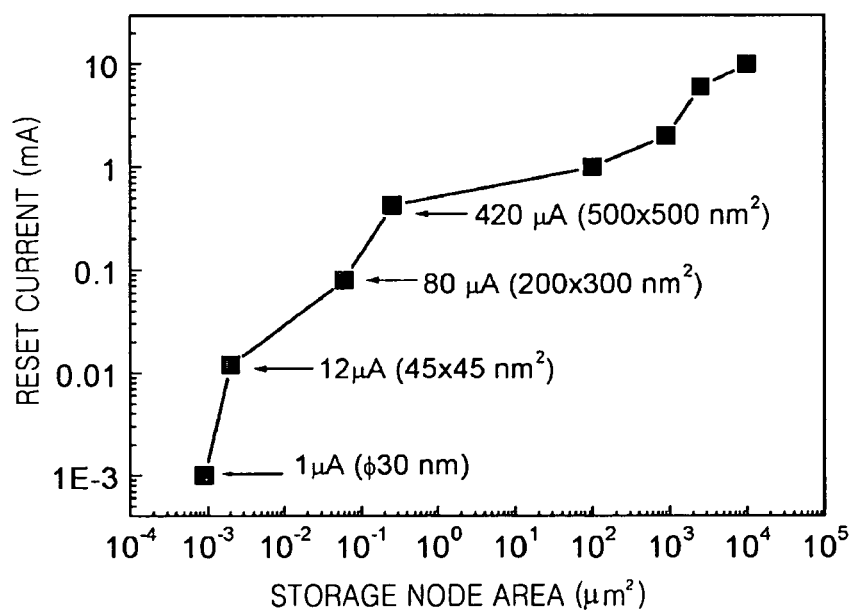
FIG. 5 is a graph showing reset currents according to the area of a storage node.

FIG. 5 is a graph showing reset currents according to the area of a storage node. Referring to FIG. 5, it is seen that as the area of the storage node is reduced, the reset current is greatly reduced. In particular, in the case of a resistive memory device having a circular storage node with a diameter of 30 nm, the reset current is 1 μA. In the case of the resistive memory device according to the present embodiment, the area of the storage node denotes an area of the circular bottom surface C1 of the intermediate layer 25 that contacts the resistance layer 24 in FIG. 2, and is smaller area of the cross-section of the hole h.

Figure 6:
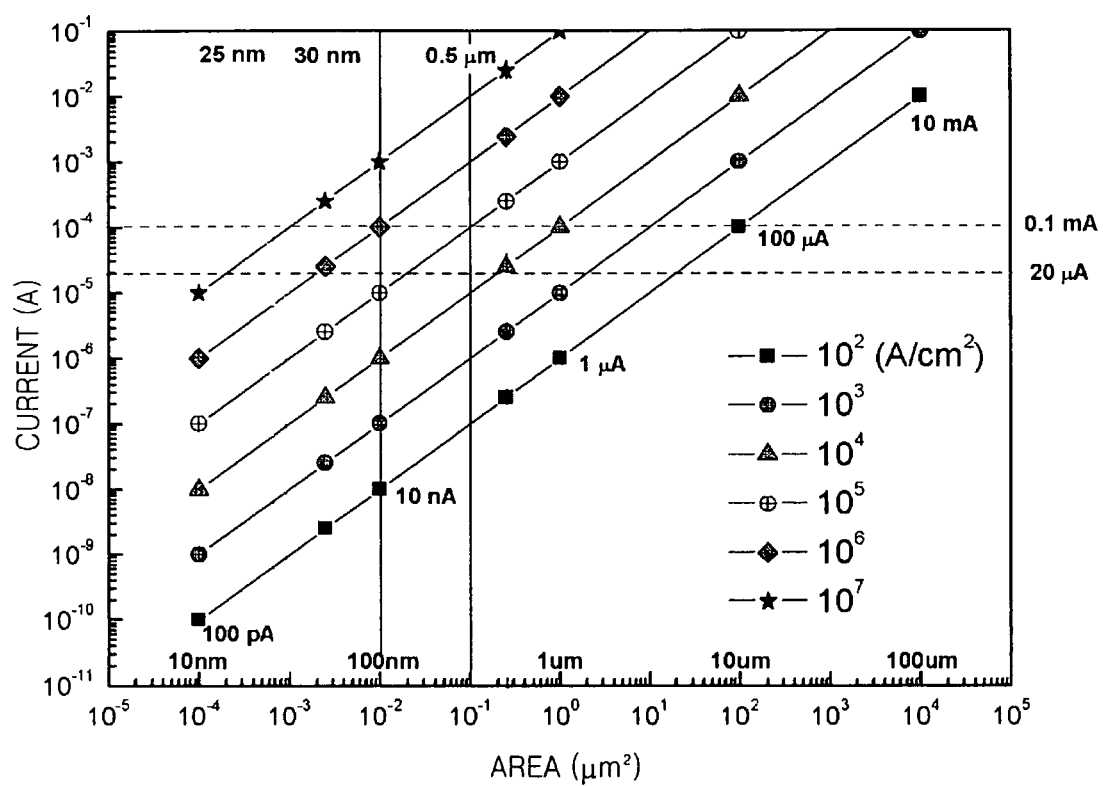
FIG. 6 is a graph showing currents that can be supplied to a resistive memory device at a particular current density according to the area of switching structure.

FIG. 6 is a graph showing currents that can be supplied to a resistive memory device at a particular current density according to the area of switch structure.

For example, in the case of a circular switch structure having an area of $10^{-2}$ μm$^2$, assuming that a variable resistance material is switched at a current of $10^{-4}$ A (0.1 mA), the current density of $10^6$ A/cm$^2$ is required. This is identical to a rectangular switch structure having a side length of 100 nm. However, like the resistive memory device according to present embodiment, if the switch structure is formed in a three-dimensional structure in the hole h, the area of the switch structure is widened. For example, like the resistive memory device according to the present embodiment, when the switch structure is formed in a three dimensional structure, an area of the bottom surface is $10^{-2}$ μm$^2$, but the total area is $10^{-1}$ μm$^2$, and thus, at a current density of $10^5$ A/cm$^2$, a switching current of $10^{-4}$ A can flow in the resistive memory device. That is, the current density required for switching the resistive memory device can be reduced by 1/10 of the current density required in a two-dimensional structure. In the case of the resistive memory device according to the present embodiment, a stable switching current can be maintained while maintaining a high integration density by forming the switch structure in a three-dimensional structure without increasing the area of the storage node.

The resistive memory device according to the present invention has the following advantages.

First, a stable switching current can be supplied while providing a high integration density of the resistive memory using a three-dimensional structure.

Second, a contact area between an area of a storage node and a switch can be readily controlled by controlling an aspect ratio of a hole when manufacturing the resistive memory device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A resistive memory device comprising:
a bottom electrode;
an insulating layer on and exposing a part of the bottom electrode, the insulating layer being a single, distinct layer;
a variable resistance layer on and conforming to the exposed part of the bottom electrode and sidewalls of the insulating layer;
an intermediate layer on and conforming to bottom and side surfaces of the variable resistance layer;
a non-ohmic switch structure on and conforming to bottom and side surfaces of the intermediate layer;
an upper electrode on the non-ohmic switch structure; the non-ohmic switch structure being in direct contact with the intermediate layer and an exposed surface of the variable resistance layer.

2. The resistive memory device of claim 1, wherein the variable resistance layer is a material with two resistance characteristics according to an applied current.

3. The resistive memory device of claim 2, wherein the variable resistance layer includes one of a transition metal oxide, a perovskite metal oxide, and a nitride compound.

4. The resistive memory device of claim 3, wherein the transition metal oxide is selected from the group consisting of Ni oxide, Ti oxide, Hf oxide, Zr oxide, Zn oxide, W oxide, Co oxide, Cu oxide, Nb oxide, Al oxide, V oxide, Cr oxide, Fe oxide, W oxide, Ta oxide, SrZrO, SrTiO, PCMO and a compound of these oxides.

5. The resistive memory device of claim 1, wherein the non-ohmic switch structure is one of a diode structure and a varistor.

6. The resistive memory device of claim 5, wherein, if the non-ohmic switch structure is the diode structure, the diode structure is a bilayer structure of a p-type semiconductor layer and an n-type semiconductor layer or a bilayer structure of an n-type oxide layer and a p-type oxide layer.

7. The resistive memory device of claim 1, wherein a total area of the switch structure is at least an order of magnitude greater than an area of a bottom surface of the non-ohmic switch structure.

8. The resistive memory device of claim 1, wherein the non-ohmic switch structure is a threshold switching device.

9. A cross-point memory array, wherein the resistive memory device of claim 1 is in an arrayed structure.

10. The cross-point memory array of claim 9, wherein the memory array is a multiple memory array structure of at least one layer.

11. A resistive memory device comprising:
a bottom electrode;
an insulating layer on and exposing a part of the bottom electrode, the insulating layer being a single, distinct layer;
a variable resistance layer on and conforming to the exposed part of the bottom electrode and sidewalls of the insulating layer;
an intermediate layer on and conforming to bottom and side surfaces of the variable resistance layer;
a non-ohmic switch structure on and conforming to bottom and side surfaces of the intermediate layer, the non-ohmic switch structure directly contacting the insulating layer, and directly contacting ends of the variable resistance layer and the intermediate layer; and
an upper electrode on the non-ohmic switch structure.

* * * * *